United States Patent
Dacy et al.

(10) Patent No.: US 6,346,907 B1
(45) Date of Patent: Feb. 12, 2002

(54) ANALOG-TO-DIGITAL CONVERTER HAVING VOLTAGE TO-TIME CONVERTER AND TIME DIGITIZER, AND METHOD FOR USING SAME

(75) Inventors: Susan M. Dacy, New Port Richey, FL (US); Marc J. Loinaz, Westfield, NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/263,173

(22) Filed: Mar. 5, 1999

Related U.S. Application Data

(60) Provisional application No. 60/095,699, filed on Aug. 7, 1998.

(51) Int. Cl.$^7$ ................................................. H03M 1/56
(52) U.S. Cl. ...................................... 341/169; 341/157
(58) Field of Search ................................. 341/156, 158, 341/168, 169, 157

(56) References Cited

U.S. PATENT DOCUMENTS

| | | | |
|---|---|---|---|
| 5,321,404 A | * | 6/1994 | Mallinson et al. .......... 341/169 |
| 5,396,247 A | * | 3/1995 | Watanabe et al. ........... 341/157 |
| 5,475,344 A | * | 12/1995 | Maneatis et al. ............. 331/57 |

OTHER PUBLICATIONS

Knotts et al. A 500Mhz Time Digitizer IC with 15.625ps Resolution, 1994 IEEE Solid–State Circuits Conference, 41st ISSCC, Feb. 16–18, 1994, pp. 58–59.*

Loinaz et al. A CMOS Multichannel IC for Pulse Timing Measurements with 1–mV Sensitivity, IEEE Journal of Solid–Staate Circuits vol. 20, No. 12, Dec. 1992, pp. 1339–1349.*

Turko et al. Ultra–Fast Voltage Comparators for Transient Waveform Analysis, IEEE Transactions on Nuclear Science, vol. 37, No. 2 Apr. 1990.*

* cited by examiner

*Primary Examiner*—Howard L. Williams
(74) *Attorney, Agent, or Firm*—Brown Raysman Millstein Felder & Steiner LLP

(57) ABSTRACT

A single slope A/D converter utilizes a sub-nanosecond time digitizer to achieve increased conversion rates independent of a high frequency clock, and so is capable of being implemented in diverse applications. High conversion rates ranging from about 3 MHz to about 12 MHz and higher may be implemented on integrated circuits without using a high frequency clock.

18 Claims, 4 Drawing Sheets

ANALOG-TO-DIGITAL CONVERTER HAVING VOLTAGE TO-TIME CONVERTER AND TIME DIGITIZER, AND METHOD FOR USING SAME

CROSS-REFERENCE TO RELATED APPLICATIONS

This disclosure is related to U.S. provisional patent application no 60/095,699, filed Aug. 7, 1998.

BACKGROUND OF THE INVENTION

The present invention relates to analog-to-digital converters and, more particularly, to a high-speed analog-to-digital converter.

One type of analog-to-digital converter (A/D converter or ADC) is a single slope converter. Such a converter transforms input signals (voltage, current, charge, etc.) into a time interval having a duration proportional to the value of the input voltage. The time interval is measured by a digital counter in terms of an integral number of clock periods. The output of the counter represents the digitized input value. The speed of the A/D converter is limited by how quickly the number of bits in the converter may be resolved by the counter. For example, for a 10-bit 10 MHz converter, a 10-GHz counter is required. Such high-rate counters are not readily implemented in imbedded applications on integrated circuits such as modems, codecs, and single-chip cameras. However, the use of embedded high-speed A/D converters in such applications is highly desired. Single-slope A/D converters are especially attractive for embedded applications because they can potentially be designed to take up very little silicon area. Prior art systems have focused on improving performance by improving the speed of the counter, which has been unsatisfactory.

Time digitizers are circuits which measure time intervals in terms of an integral number of propagation delays or gate delays, or fractions thereof. PLL-based time digitizers have traditionally been used in high-speed instrumentation for digital IC testing and for particle physics experiments, but have not been used in relatively slower A/D converters.

SUMMARY OF THE INVENTION

Advantageously, it is recognized that such time digitizers can replace the limited counters in single slope A/D converters. An A/D converter combines a voltage-to-time-interval capability with a PLL-based time digitizer. The result is a high speed single-slope A/D capable of operating above 10 MHz. This converter dissipates very little power and consumes very little circuit area, making it especially suitable for embedded applications. Furthermore, the converter may be designed, with minimal additional circuitry, to be programmable so that conversion rate can be traded off with resolution. For example, the same converter having a 10-bit resolution with a conversion rate of 10 MHz can be electrically programmed to have an 8-bit resolution with a conversion rate of 40 MHz, a 6-bit resolution with a conversion rate of 160 MHz, as well as a 12-bit resolution with a conversion rate of 2.5 MHz or a 16-bit resolution with a conversion rate of 625 kHz.

The fabrication and cost considerations of using more components and complexity in incorporating time digitizers into A/D converters is far outweighed by the speed, resolution, and adjustable programmability of such A/D converters using time digitizers. The prior art relied on merely increasing the speed of inherently slow counters with limited performance characteristics, and the field of A/D conversion is considered to be distinct from the field of high speed instrumentation. Accordingly, in view of the limitations of the prior art, the advantages of implementing such time digitizers from high speed instrumentation into A/D converters are both numerous and significant in improving the performance of A/D converters.

DETAILED DESCRIPTION

Figure 1:
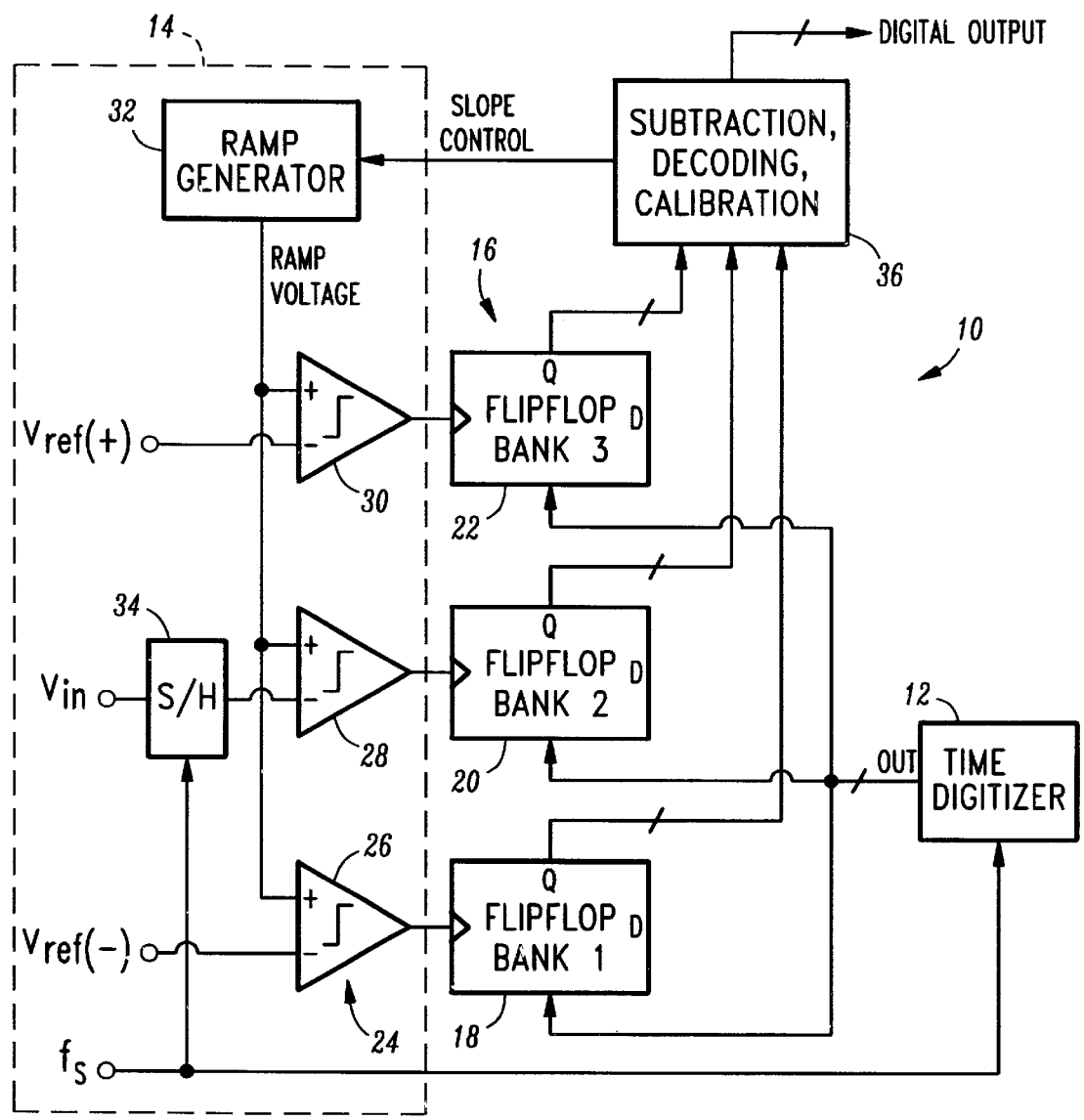
FIG. 1 illustrates the disclosed A/D converter.

Referring to FIG. 1, an analog-to-digital (A/D) converter 10 is illustrated which achieves excellent resolution while consuming very little power, as well as taking up very little silicon area when implemented on an integrated circuit. The A/D converter 10 may be fabricated to provide a 10 bit resolution at a 10 MHz sampling rate using 0.25 $\mu$m complementary method oxide semiconductor (CMOS) technology. The area of the A/D converter 10 should be under 0.5 mm$^2$, and the power should be under 30 mW. A time digitizer 12 is used, as described herein, which may be designed to be programmable such that the same circuit 10 may be used not only as a 10 bit, 10 MHz A/D converter, but also as a 12 bit, 2.5 MHz A/D converter, and a 14 bit, 625 kHz A/D converter. Resolution may also be reduced in exchange for speed to implement an 8 bit, 40 MHz A/D converter, and a 6 bit, 160 MHz A/D converter. The low power, relatively small area, and programmability of the A/D converter 10 are extremely attractive features and advantages for implementing A/D converters 10 on integrated circuits.

The disclosed A/D converter 10 shown in FIG. 1 includes a sub-nanosecond time digitizer 12 for receiving the single slope inputs from the voltage-to-time converter 14 through a set 16 of flip-flop banks 18–22. The voltage-to-time converter 14 includes a set 24 of comparators 26–30 which generates clocking pulses to respective flip-flop banks 18–22 in response to an increasing ramp voltage from a ramp generator 32 exceeding an input reference voltage, respectively. A first comparator 26 compares a first reference voltage $V_{ref(-)}$ to the ramp voltage to clock the first flip-flop bank 18. A second comparator 30 compares a second reference voltage $V_{ref(+)}$ to the ramp voltage to clock the second flip-flop bank 22. A third comparator 28 compares a sample of an input voltage $V_{IN}$, received from a sample-and-hold circuit 34, to the ramp voltage to clock the third flip-flop bank 20.

Both the time digitizer 12 and the sample-and-hold circuit 34 are clocked by a converter sampling signal having a sample frequency $f_S$, so the output of the time digitizer 12, being the states of a ring oscillator therein, is loaded into the flip-flop banks 18–22, and so a word or set of bits corresponding to the ring oscillator states is latched; that is, a snapshot of the oscillator states is taken which digitizes the input voltage $V_{IN}$. A subtraction, decoding, and calibration circuit 36 known in the art receives the digitized input voltage $V_{IN}$ to generate a final digital output corresponding to $V_{IN}$. In addition, the circuit 36 also generates a slope control signal which is applied to the ramp generator 32 to calibrate and adjust the slope of the ramp voltage during the A/D conversion operation.

Figure 2:
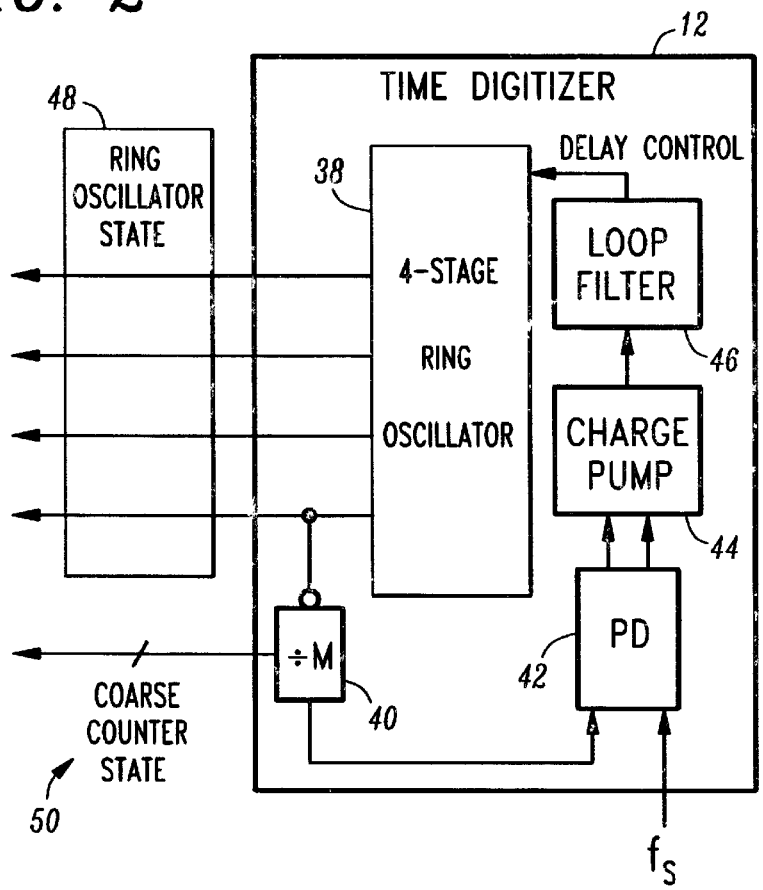
FIG. 2 illustrates the time digitizer components in greater detail.

The time digitizer 12 is a state machine which changes state every $T_{LSB}$ seconds. In an illustrative embodiment shown in FIG. 2, the time digitizer 12 includes an N-stage ring oscillator 38, a coarse counter 40, and an phase-locked loop which is implemented by a phase detector (PD) 42, a charge pump 44, and a loop filter 46. In an illustrative embodiment, the ring oscillator 38 is a four-state ring oscillator. The ring oscillator state 48 for each of the states of the ring oscillator 38 is read out to the set 16 of flip-flop banks in FIG. 1. The coarse counter 40 generates a coarse counter state 50 from the most significant bits (MSBs) of the ring oscillator state 48, and the coarse counter state 50 is read out with the ring oscillator state 48 to be decoded by the decoding component of the circuit 36. The coarse counter 34 also includes a divider for dividing the MSBs by a divider ratio M, with the divided values being input with the sample frequency clock $f_S$ to the PD 42.

The phase-locked loop with components 42–46 then generates a delay control signal which is applied to the ring oscillator 38, such that the feedback in the time digitizer 12 sets $T_{LSB}$ to the regulated value:

$$T_{LSB} = \frac{1}{f_S \times 2N \times M}$$

with N being the number of ring oscillator stages.

The resolution of the time digitizer 12 may be improved with the use of ever faster ring oscillator circuits 38, which implies shorter propagation delays or gate delays inside the ring oscillator interpolating between ring oscillator output edges, as described in T. A. Knotts et al., "A 500 MHz Time Digitizer IC with 15.62 ps Resolution", IEEE INTERNATIONAL SOLID-STATE CIRCUITS CONFERENCE (1994), pp. 58–59.

Figure 3:
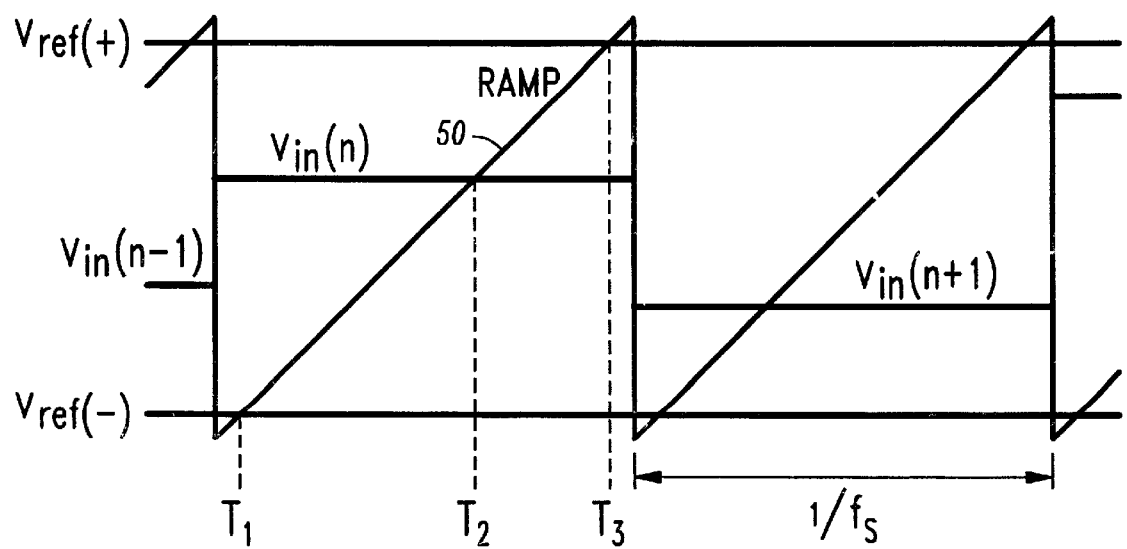
FIG. 3 illustrates the input voltages to the A/D converter of FIG. 1.

The flip-flop banks 18–22 of FIG. 1 take a snapshot of the state of the time digitizer 12, including both the ring oscillator 48 and the coarse counter 50, on the rising edge of their strobe inputs. The flip-flop banks 18–22 effectively measure and digitize the times $T_1$, $T_2$, and $T_3$, respectively, in FIG. 3, during which the ramp voltage cyclically increases as shown in the sawtooth waveform 50 having a period of $1/f_S$ for sampling the input voltage $V_{IN}$, including the sampled input voltages at sample times n−1, n, n+1, etc. $T_2$ occurs between $T_1$ and $T_3$, and its value is directly related to the value of the sampled input voltage. If the time $T_3-T_1$ is constant and/or well-defined, the digital output can be easily computed using the equation:

$$\text{Digital Output} = \left(\frac{T_2 - T_1}{T_3 - T_1}\right) 2^K$$

in which K is the number of output bits in the digital output.

The quantity $T_3-T_1$ can be used to regulate the slope of the ramp 50 so that the input voltage range of the A/D converter 10 is constant and well-defined, even in the presence of manufacturing process shifts, supply voltage variations, and temperature changes. The regulation of the ramp slope 50 occurs in the background and does not require the A/D converter 10 to be halted for calibration to take place, which is a unique feature of the disclosed A/D converter 10 and architecture.

Figure 4:
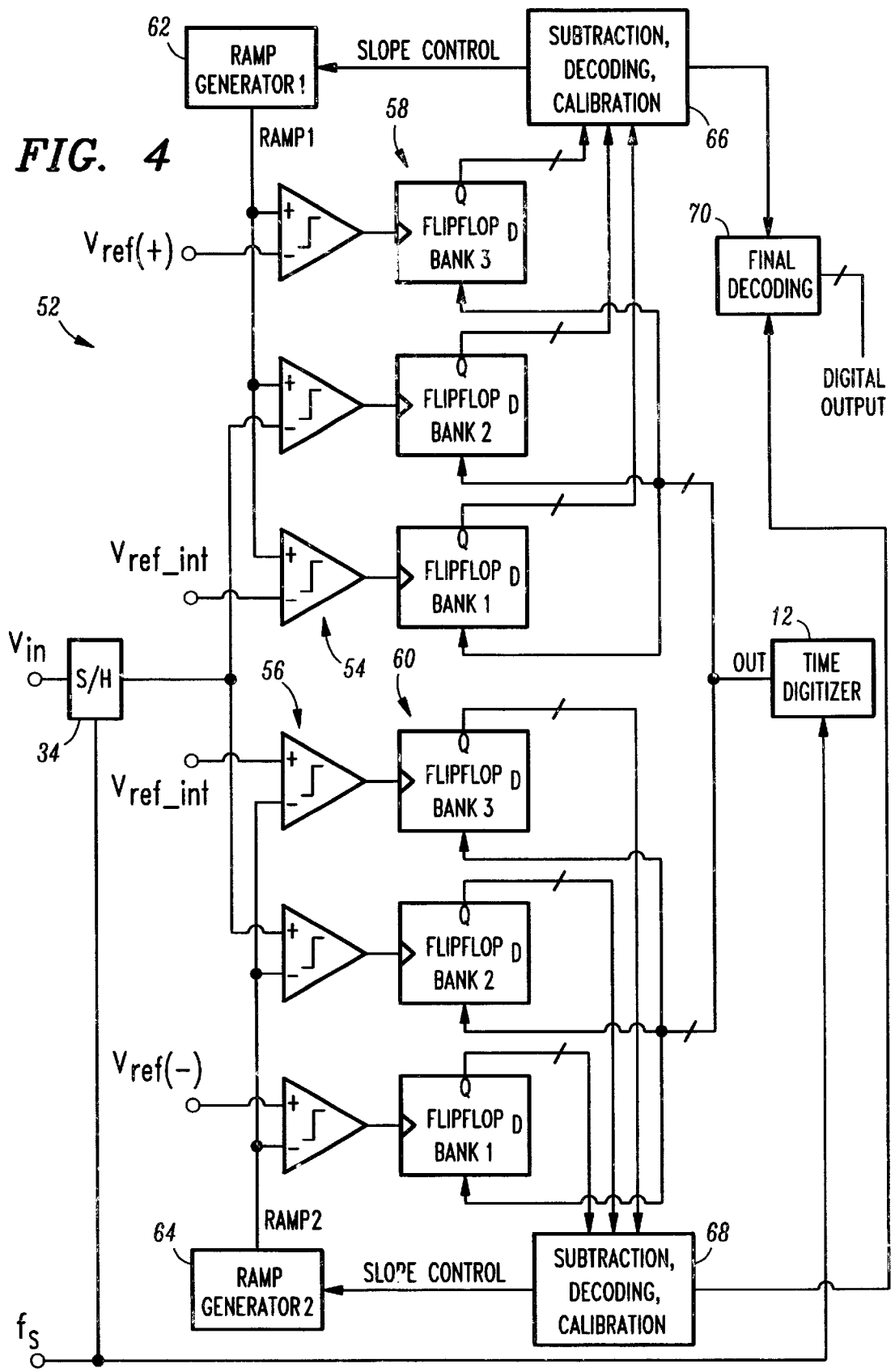
FIG. 4 illustrates an alternative embodiment of the disclosed A/D converter providing a dual sub-range implementation.
Figure 5:
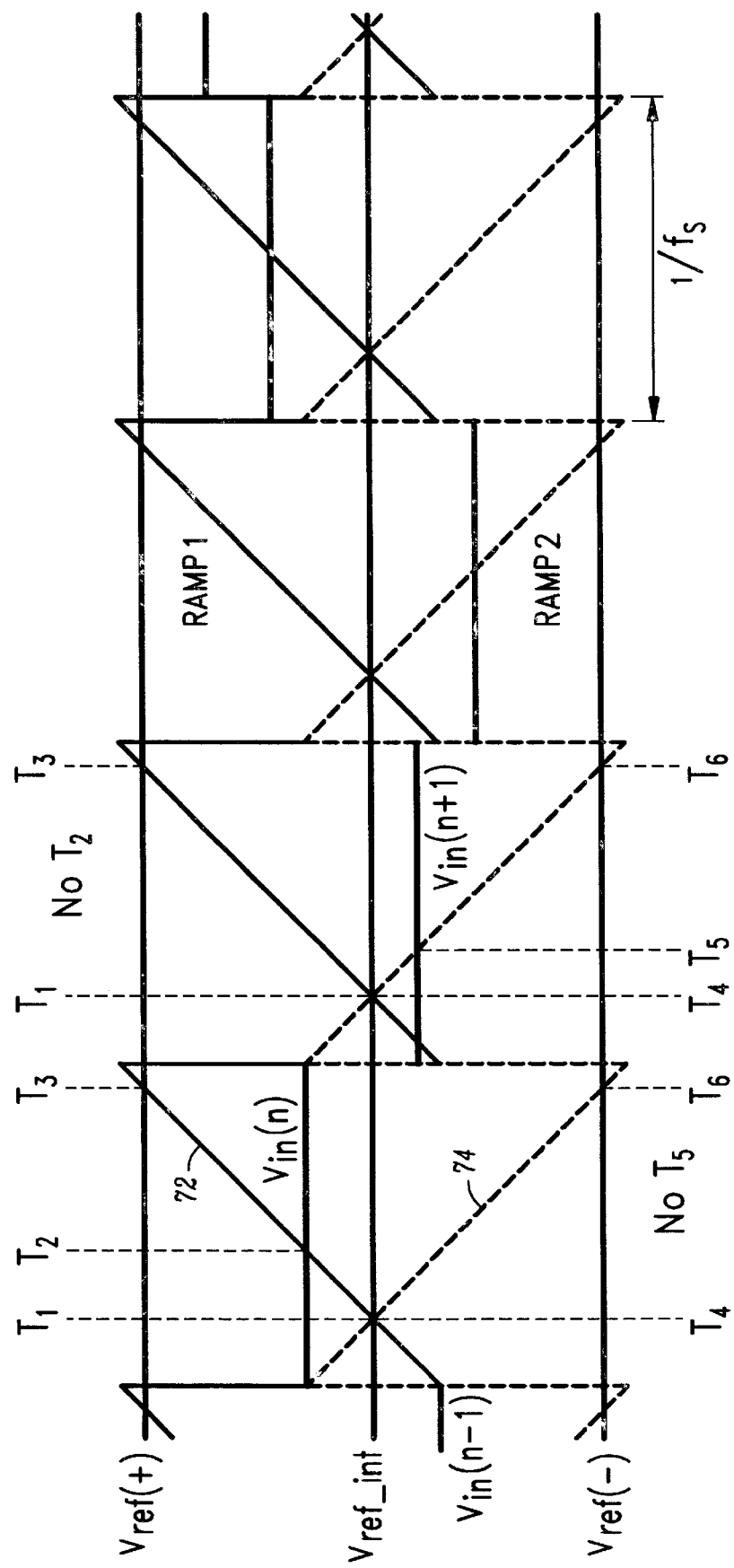
FIG. 5 illustrates the input pulses to the dual sub-range implementation of FIG. 4.

In an alternative embodiment shown in FIG. 4, sub-ranging is performed by the A/D converter 52 to increase the sampling rate of the A/D converter 52. Such sub-ranging may be performed using, for example, two sub-ranges of equal size and two ramp waveforms, as shown in FIG. 5. Since there are two ramps that each cover half of the voltage range in the previous embodiment in FIG. 3, the A/D converter 52 of FIG. 4 may be designed to be twice as fast as the A/D converter 10 of FIG. 1 by providing additional components. Alternatively, the sampling rate may remain the same as in the A/D converter 10 of FIG. 1, but the resolution is doubled. Referring to FIG. 4, two sets 54, 56 of comparators and two sets 58, 60 of flip-flop banks are used with a common time digitizer 12 as in FIG. 2 to digitize the various ramp crossing times, as shown in FIG. 5. The set 54 of comparators receives input voltages $V_{ref+}$, $V_{IN}$, and $V_{ref-int}$, and the set 56 of comparators receive the input voltages $V_{ref-int}$, $V_{IN}$, and $V_{ref(-)}$, in which $V_{ref-int}$ is an intermediate reference voltage. The sets 54, 56 of comparators also receive respective ramp signals Ramp1, Ramp2 from the ramp generators 62, 64, respectively. If the input sample is less than $V_{ref-int}$, all three comparators in the lower set 56 will trigger, but if the input sample is greater than $V_{ref-int}$, all three comparators in the upper set 54 will trigger. The final decoding circuit 70 determines which subrange the input sample is in, depending on which of the comparators trigger.

Snapshots of the outputs of the time digitizer 12 are divided such that an upper portion is latched by the upper set 58 of flip-flop banks, and a lower portion is latched by the lower set 60 of flip-flop banks. The outputs of the sets 58, 60 are respectively provided to the subtraction, decoding, and calibration circuits 66–68, which generate respective slope control signals to the ramp generators 62, 64. The circuits 66–68 also output respective portions of the digital output to a final decoding circuit 70 to be combined therein to produce the final digital output word. The number of sub-ranges may be increased to improve either the speed or resolution of the converter 52 in exchange for additional circuit area and complexity. Also, the use of two sub-ranges is especially easy to implement with the use of fully-differential circuitry techniques known in the art.

As shown in FIG. 5, two ramping waveforms 72, 74 correspond to the ramp signals Ramp1, Ramp2, respectively. The respective sets 54, 56 of comparators receive the ramp waveforms 72, 74 to measure the times $T_1$, $T_2$, $T_3$, $T_4$, $T_5$, $T_6$ upon the respective triggering of the comparators in the sets 54, 56, in a manner as described above for FIG. 3. The ramp slopes may be adjusted so that $T_3-T_1$ and $T_6-T_4$ are a constant number of counts over process, temperature, and power supply variations. For a voltage in a first subrange, there is no value $T_2$ to measure, while for a voltage in a second sub-range, there is no value $T_5$ to measure.

An A/D converter and method has been disclosed herein, which uses a voltage-to-time circuit with a phase-locked loop (PLL)-based time digitizer. Comparators and ramp generators produce waveforms which transform a sampled input voltage into a time interval directly related to the sampled input voltage. The PLL-based time digitizer uses the propagation delay, or fraction thereof, through a circuit as the integral time measurement unit. Thus, the A/D converter combines expertise from very different areas in electronic circuit design, with the design of ramp generators in the area of low-speed (less than 1 MHz) A/D converters, and with the design of PLL-based time digitizers in the area of high-frequency test instrumentation.

Also disclosed is a background ramp slope regulation technique, which avoids the prior art halting of the converter to be placed in a calibration mode in order to form the ramp slope to be measured and modified through feedback. Thus, the disclosed A/D converter avoids the inconvenience in many applications, such as communication systems, when the A/D must operate continually and at as high a rate as possible. In addition, sub-ranging with multiple ramp slopes is used with the PLL-based time digitizer.

The disclosed A/D converter 10 and the present disclosure may also incorporate numerous features and implementations described in U.S. provisional patent application no. 60/095,699, filed Aug. 7, 1998, which is incorporated herein by reference. However, it is to be understood that numerous modifications and substitutions may be had without departing from the spirit of the invention. Accordingly, the invention has been described by way of illustration rather than limitation.

What is claimed is:

1. An analog-to-digital (A/D) converter, comprising:
    a voltage-to-time converter, responsive to an analog input voltage, for generating a time interval related in length to the input voltage;
    a time digitizer circuit for counting the time interval relative to a predetermined time delay of the time digitizer circuit to generate a digital output signal corresponding to the analog input voltage; and
    wherein the time digitizer circuit counts the time interval using an adjustable divider, wherein a division ratio of the time digitizer circuit can be reprogrammed.

2. The A/D converter of claim 1, further comprising:
    a latch, responsive to the time interval, for latching the predetermined time units to generate the digital output signal therefrom;
    wherein the time digitizer circuit includes a phase-locked loop (PLL) including a ring oscillator for generating a delay control signal, the ring oscillator being responsive to the delay control signal for generating the predetermined time units, and wherein the predetermined time units are at least portions of the propagation delays of the ring oscillator.

3. The A/D converter of claim 2, wherein the predetermined time units are fractions of the propagation delays of the ring oscillator.

4. The A/D converter of claim 2, wherein the predetermined time units are set using the phase-locked loop.

5. The A/D converter of claim 2, wherein the time digitizer includes:
    a coarse counter;
    wherein the latch latches the least significant bits (LSBs) of the counted time interval; and
    wherein the coarse counter counts the most significant bits (MSBs) of the counted time interval.

6. The A/D converter of claim 1, wherein the voltage-to-time converter includes:
    a ramp generator for generating a ramp voltage which varies with a pre-set slope from a start voltage to an end voltage during a ramping cycle; and
    a comparator, responsive to the ramp voltage and the input voltage, for generating the time interval when the ramp voltage attains the input voltage.

7. An analog-to-digital (A/D) converter, comprising:
    a voltage-to-time converter, responsive to an analog input voltage, for generating a time interval related in length to the input voltage, the voltage-to-time converter including:
        a ramp generator for generating a ramp voltage which varies with a pre-set slope from a start voltage to an end voltage during a ramping cycle; and
        a comparator, responsive to the ramp voltage and the input voltage, for generating the interval when the ramp voltage attains the input voltage;
    a time digitizer circuit for counting the time interval relative to a predetermined time delay of the time digitizer circuit to generate a digital output signal corresponding to the analog input voltage; and
    a calibration circuit for generating a calibration signal during A/D conversion operation;
    wherein the ramp generator is responsive to the calibration signal for adjusting the shape of the ramp waveform.

8. An analog-to-digital (A/D) converter, comprising:
    a voltage-to-time converter, responsive to an analog input voltage, for generating a time interval related in length to the input voltage;
    a time digitizer circuit for counting the time interval relative to a predetermined time delay of the time digitizer circuit to generate a digital output signal corresponding to the analog input voltage;
    a plurality of sets of latches, each set of latches corresponding to a sub-range of input voltages and being responsive to the time interval, for latching the predetermined time units to generate a portion of the digital output signal therefrom; and
    wherein the voltage-to-time converter includes:
        a plurality of ramp generators for generating respective ramp voltages which vary with a pre-set slope from a start voltage to an end voltage during a ramping cycle; and
        a plurality of sets of comparators, each set corresponding to a sub-range of input voltages and being responsive to the ramp voltage and the input voltage, for generating the time interval when the raw voltage attains the input voltage, with each time interval applied to the respective latches in the set of latches corresponding to the sub-range.

9. The A/D converter of claim 8, further comprising:
    a plurality of decoding circuits, each connected to a respective set of latches corresponding to a sub-range, for decoding the outputs to generated the portion of the digital output; and
    a final decoder for combining the portions to generate the final digital output.

10. The A/D converter of claim 9, wherein each decoding circuit generates a respective slope control signal for output to a respective ramp generator corresponding to the respective sub-range of the decoding circuit, to adjust the slope of the ramp voltage.

11. An analog-to-digital (A/D) converter comprising:
    a voltage-to-time converter having:
        a ramp generator for generating a ramp voltage with a single pre-set slope with the ramp voltage varying from a start voltage to an end voltage during a ramping cycle; and
        a comparator, responsive to the ramp voltage and the input voltage, for generating a time interval proportional in length to an input voltage when the ramp voltage attains the input voltage;
    a time digitizer circuit for counting the time interval and having a phase-locked loop, the phase-locked loop including a ring oscillator, for generating a delay control signal, the ring oscillator, responsive to the delay control signal, for generating predetermined time units which are fed back to the phase-locked loop;

a latch, responsive to the time interval, for counting the least significant bits (LSBs) of the time unit;

a coarse counter, responsive to the time interval, for counting the most significant bits (MSBs) of the time units; and a decoder for combining the counts from the latch and the coarse counter to generate digital output signal corresponding to the analog input voltage, the decoder including a calibration circuit for generating a calibration signal during the A/D conversion operation, with the decoder generating the digital output signal outside of the calibration cycle; and wherein the ramp generator is responsive to the calibration signal for adjusting the pre-set single slope.

12. An analog-to-digital (A/D) converter comprising:

a voltage-to-time converter having:
   a plurality of ramp generators for generating respective ramp voltages which vary with a pre-set slope from a start voltage to an end voltage during a ramping cycle; and
   a plurality of sets of comparators, each set corresponding to a sub-range of input voltages and being responsive to the ramp voltage and the input voltage, for generating the time interval when the ramp voltage attains the input voltage;

a time digitizer circuit for counting the time interval and having a phase-locked loop, the phase-locked loop including a ring oscillator, for generating a delay control signal, the ring oscillator, responsive to the delay control signal, for generating predetermined time units which are fed back to the phase-locked loop;

a latch, responsive to the time interval, for counting the least significant bits (LSBs) of the time unit;

a coarse counter, responsive to the time interval, for counting the most significant bits (MSB) of the time units; and a decoder for combining the counts from the latch and the coarse counter to generate digital output signal corresponding to the analog input voltage; and a plurality of sets of latches, each set of latches corresponding to a sub-range of input voltages and being responsive to the time interval, for latching the predetermined time units to generate a portion of the digital output signal therefrom;

wherein each time interval generated by the comparators is applied to the respective latches in the set of latches corresponding to the sub-range.

13. The A/D converter of claim 12, further comprising:

a plurality of decoding circuits, each connected to a respective set of latches corresponding to a sub-range, for decoding the outputs to generated the portion of the digital output; and a final decoder for combining the portions to generate the final digital output.

14. The A/D converter of claim 13, wherein each decoding circuit generates a respective slope control signal for output to a respective ramp generator corresponding to the respective sub-range of the decoding circuit, to adjust the slope of the ramp voltage.

15. A method for performing analog-to-digital (A/D) conversion of an analog input voltage, the method comprising the steps of:

generating a time interval proportional in length to the input voltage;

counting the time interval relative to a predetermined time delay of a time digitizer circuit to generate a digital output signal corresponding to the analog input voltage;

generating a ramp voltage which varies with a pre-set slope from a start voltage to an end voltage during a ramping cycle;

generating, responsive to the ramp voltage and the input voltage, the time interval when the ramp voltage attains the input voltage;

generating a calibration signal during A/D conversion operation; and adjusting the pre-set slope in response to the calibration signal.

16. The method of claim 15, wherein the step of counting includes the steps of:

generating a delay control signal using a phase-locked loop including a ring oscillator;

responding to the delay control signal to generate the predetermined time units, wherein the predetermined time units are propagation delays of the ring oscillator; and responding to the time interval to latch the predetermined time units to generate the digital output signal therefrom.

17. The method of claim 15, further comprising the step of setting the predetermined time units using the phase-locking loop.

18. The method of claim 15, wherein the step of counting includes the steps of:

counting the least significant bits (LSBs) of the counted time interval using a latch; and counting the most significant bits (MSBs) of the counted time interval using a coarse counter.

* * * * *